United States Patent [19]

Naegeli et al.

[11] Patent Number: 4,675,613
[45] Date of Patent: Jun. 23, 1987

[54] NOISE COMPENSATED SYNCHRONOUS DETECTOR SYSTEM

[75] Inventors: Andrew H. Naegeli; Stuart L. Carp, both of Menlo Park, Calif.

[73] Assignee: Hewlett-Packard Company, Palo Alto, Calif.

[21] Appl. No.: 883,464

[22] Filed: Jul. 11, 1986

Related U.S. Application Data

[63] Continuation of Ser. No. 522,122, Aug. 11, 1983, abandoned.

[51] Int. Cl.$^4$ ............... H03K 9/06; H03D 13/00
[52] U.S. Cl. ............... 328/133; 328/14; 328/167; 307/527; 307/529; 307/543; 331/1 R; 329/50; 329/130
[58] Field of Search ............... 328/14, 15, 133, 150, 328/165, 166, 167, 138; 307/527, 529, 556, 543; 331/1 R; 455/296, 312, 309; 329/50, 130; 330/302, 303, 306

[56] References Cited

U.S. PATENT DOCUMENTS

| | | | |
|---|---|---|---|
| 2,979,611 | 4/1961 | Halina | 328/133 |
| 3,122,704 | 2/1964 | Jones | 329/50 |
| 3,209,271 | 9/1965 | Smith | 329/122 |

OTHER PUBLICATIONS

"Communications Systems", by Bruce Carlson, McGraw Hill, 1975 pp. 134, 202–205.

Primary Examiner—Stanley D. Miller
Assistant Examiner—Richard Roseen
Attorney, Agent, or Firm—Edward Y. Wong; Paul L. Hickman

[57] ABSTRACT

A circuit in a synchronous detector system is provided to minimize and compensate for the errors induced by phase modulation and additive noise in the system. In one embodiment a first-order correction of such errors is achieved by equipping the synchronous detector system with a constant loop filter noise bandwidth and an RMS detector. A resolution filter passing the detected system signal to the RMS detector for correction is made to have a noise bandwidth identical to the loop filter noise bandwidth.

13 Claims, 8 Drawing Figures

NOISE COMPENSATED SYNCHRONOUS DETECTOR SYSTEM

This is a continuation of co-pending application Ser. No. 522,122 filed on Aug. 11, 1983, now abandoned.

BACKGROUND OF THE INVENTION

Accurate measurement of the level of radio frequency signals is important in receiver measurements and in many other applications. For example, such measurements are especially important in the measurement of unmodulated signals or continuous wave (CW) signals, such as those in signal generator calibration and attenuation measurements. At low signal levels, the random noise added to the signal being measured creates errors in the measurement of such signal levels, and as the signal level decreases, the percentage error caused by the noise increases. This effect is well-known in the prior art and has been described analytically by many people.

In the prior art, several solutions have been proposed to increase the accuracy of measuring low level signals imbedded in random noise. One such proposal is to filter the signal in a narrow bandwidth before detection, either by RMS detection or average detection. By doing so, the effect of noise is correspondingly decreased. At narrow bandwidths before detection, however, tuning the signal to the center of the narrow bandwidth filter in the measuring process becomes difficult. Furthermore, as the detection bandwidth gets narrower, the measurement becomes more susceptible to residual phase modulation (PM) and residual frequency modulation (FM) on the signal. This susceptibility to PM and FM introduces errors caused by modulation components falling outside of the filter bandwidth. Because of this, exact centering of the signal in the filter bandwidth becomes even more critical. Additionally, a narrow filter bandwidth becomes more susceptible to frequency drift of the signal; errors are thus introduced as the signal drifts out of the filter passband. Qualitative analyses of these errors will be discussed below.

Another solution in the prior art is to correct for noise error after detection. This solution, however, requires the signal-to-noise ratio (SNR) to be known at all times. And in order to know the SNR, the noise level must be measured. This involves removing the signal from the instrument and measuring the noise, thus adding a complication to the measurement process. Furthermore, when the difference between noise level and signal level is very small, the SNR measurement becomes impractical and imprecise.

Still another solution in the prior art is the prior art synchronous detector system in which dc error caused by noise can be eliminated. One major problem is where to get the required synchronized signal. Even if there is a high level sample of the signal to be measured, at high frequencies the disadvantage to this is that the required synchronized signal in the system may leak into the measurement system. This would add to and mask the low-level signal being measured. To counter this problem, it has been proposed that a phase lock loop (PLL) always operating at a low frequency be used to derive the reference signal for the synchronous detector. Though a PLL-derived reference signal eases the problem of masking a low-level signal, it also responds to the noise and phase or frequency modulation on the signal being locked on. The level of the phase noise can be reduced by decreasing the loop bandwidth. However, by decreasing the bandwidth, tracking a drifting signal or a wider bandwidth signal will be more difficult. This is evident from the following analysis.

In a typical ideal synchronous detector, synchronous detection is accomplished by mixing the input signal down to 0 Hz with another signal having the same frequency and phase. The mixer involved is a switching multiplier. If the input signal is represented by Vs cos wct and the switching signal by 2[cos wct+($\frac{1}{3}$) cos 3wct+(1/5) cos 5wct+ ... ], then the multiplier output Vo can be represented by $$Vo(t) = (Vs)[1 + \cos 2wct - (\tfrac{1}{3}) \cos 2wct + \dots ].\qquad \text{Eq. 1}$$

This output is processed through a low-pass filter to leave Vs, a dc component proportional to the input signal level. If the input signal happens to be amplitude modulated, the demodulated audio will also appear at the output of the synchronous detector.

At high input SNRs, detection linearity is determined by the characteristics of the switching multiplier. As a result, nonlinearities as small as approximately 0.003 dB for each 10-dB input change are possible. Complications arise, however, when the SNR is reduced; in this case, significant nonlinearities can result.

Figure 1:
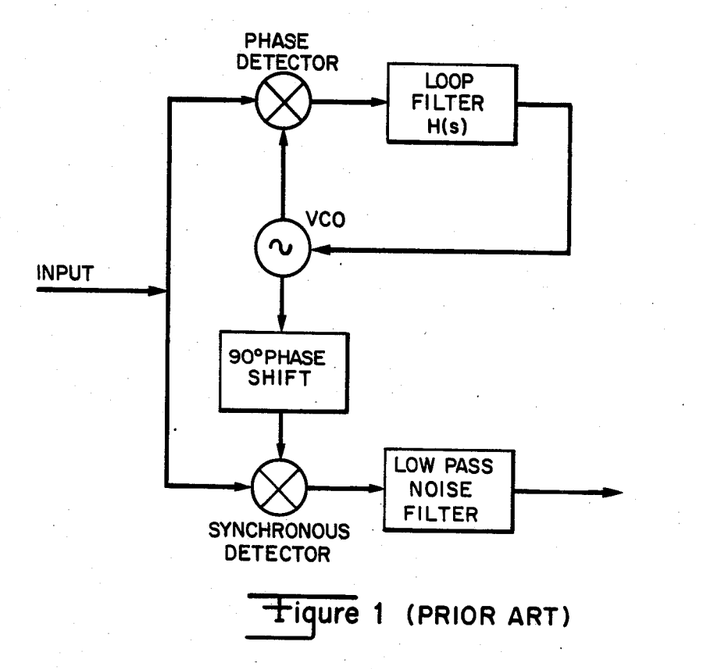
FIG. 1 shows the typical synchronous detector in the prior art.

In a prior art synchronous detector circuit, most of the synchronous detection circuitry is used to generate the high-level local oscillator (LO) input signal required by the mixer. This signal must be in phase with the test input signal and must be capable of tracking an input that may be drifting, for example, over severl kHz. In order to accomplish this, a voltage-controlled (VCO) oscillator that generates the LO signal is phase locked to the input signal. The phase-locked loop employed for the task causes the VCO to lock in phase quadrature with the input signal. As a result, the VCO's output is phase shifted by 90 degrees in order to create the proper zero-degree phase relationship between the LO and the input signal. This system is illustrated in FIG. 1. The synchronous detector error performance, as well as the overall loop response, in this system is determined by the phase-locked loop filter.

Although synchronous detection in general offers considerable improvement in noise performance over conventional envelope detection techniques, it does have its disadvantages. For example, consider an input signal consisting of an unmodulated carrier at 455 kHz surrounded by additive white noise in a bandwidth of 30 kHz. Its noise can be separated into two independent components: an in-phase component ni(t) and a quadrature component nq(t). These components are uncorrelated stochastic signals and are limited in bandwidth, here for example, to 15 kHz. As a result, the composite input signal Vi(t) may be represented as:

$$Vi(t) = Vs \cos wct + ni(t) \cos wct - nq(t) \sin wct.\qquad \text{Eq. 2}$$

By considering the LO signal to be an ideal signal, 2 cos wct, and performing basic linear analog multiplication, Equation 1 can also be expressed as:

$$Vo(t) = Vs + ni(t) + [Vs + ni(t)] \cos 2wct - nq(t) \sin 2wct.\qquad \text{Eq. 3}$$

This result exemplifies two facts to the use of synchronous detection. For one thing, the noise is additive at the output. It is not multiplied onto the input signal as in envelope detection. As a result, the desired signal Vs can always be recovered. Output noise can be reduced whenever necessary by adding low-pass filtering to the output. The second fact in using synchronous detection is that only the in-phase noise component is translated to baseband; the quadrature component is rejected. When down-converted, the additive noise sidebands on each side of the input carrier "fold-over" and add in power level, since the two sidebands are uncorrelated. In contrast, the peak value of the input signal is translated directly to the output, due to the synchronization of the LO with the carrier. As a result, the power in the desired output component is related to the peak of the input signal voltage. The undesired noise output power is related to the RMS noise input voltage.

These two facts of synchronous detections, however, are valid only for ideal synchronous detection where the LO signal is exactly in phase with the input signal. Most of the problems associated with implementing synchronous detectors stem from the inability of the phase-locked loop to provide an LO signal with exactly the right phase.

One of the realities faced by any synchronous detector in the prior art is the unavoidable existence of residual phase modulation (PM) on the input signal. The prior art synchronous detector is specifically designed for use with CW signals. When there are fluctuating phase conditions at the input signal, the phase-locked loop will attempt to follow and track out the phase modulation. If the bandwidth of the PLL is large enough to accept all the phase-modulated sidebands contained in the input signal, the VCO will track the incoming signal's phase perfectly, and the two inputs of the synchronous detector would be exactly in phase. However, due to noise constraints, the bandwidth of the prior art PLL must be kept narrow. As a result, some phase-modulated sidebands will fall outside of the PLL's bandwidth and the synchronous detector's inputs will not remain perfectly in phase, thus resulting in PM noise in the prior art synchronous detectors.

Figure 2A:
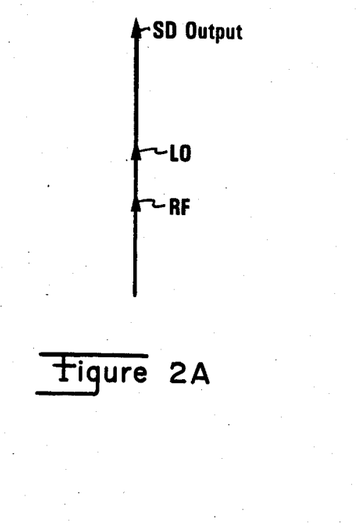
FIGS. 2A and 2B show the phasor components of a detected output and the phasors causing noise.
Figure 2B:
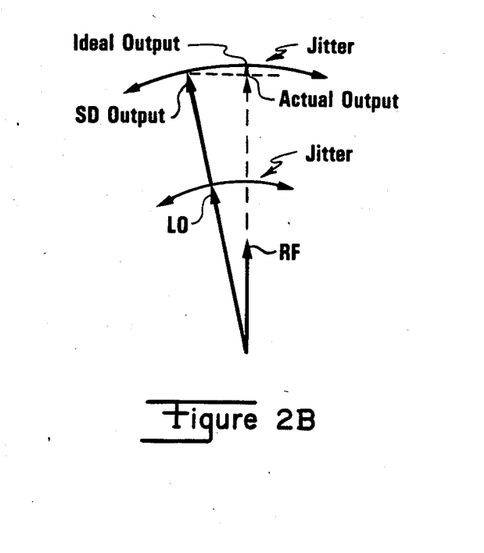

This resultant PM noise can be better understood by viewing the synchronous detector inputs as phasors that are multiplied together in the manner of FIGS. 2A and 2B. The synchronous detector's output is proportional to the cosine projection of the input phasor on the LO phasor. The maximum output occurs when the two phasors line up exactly as shown in FIG. 2A. The slight PLL mistracking caused by residual input phase modulation produces the relative phase jitter between the inputs. This phenomenon is shown in FIG. 2B. This jitter causes the average output level to fluctuate below the ideal maximum output level.

The effect of having the actual synchronous detector output at a lower than ideal level can be illustrated by the following example. Suppose that the input signal has a small amount of sinusoidal phase modulation at a rate of wm, with a peak LO phase deviation of B radians. Relying on an analysis similar to that which led to Equation 1, the synchronous detector output in this can be shown to be $$Vo(t) = (Vs) \cos [B \cos wmt - B' \cos (wmt + Ep) + \ldots ], \qquad \text{Eq. 4}$$

where B' is the equivalent peak phase deviation in radians of the PM that the VCO picks up, Ep is the phase error between the two inputs, and the ellipses represent the higher frequency terms. If wm is much less than the PLL bandwidth, the VCO will track the input signal almost perfectly. This ideal case produces a synchronous detector output of Vs.

When wm is much greater than the PLL bandwidth, the VCO will track very little of the incoming phase modulaton, and the detector output can be approximated by:

$$Vo(t) = (Vs) \cos (B \cos wmt). \qquad \text{Eq. 5}$$

Using the Bessel series representation of $$\cos (x \cos y) = J_0(x) - 3J_2(x) \cos 2y + 2J_4(x) \cos 4y + \ldots ] \qquad \text{Eq. 6}$$

equation 5 can be expanded to $$Vo(t) = (Vs)[J_0(B) - 2J_2(B) \cos 2wmt + \ldots ], \qquad \text{Eq. 7}$$

where the J terms are Bessel coefficients and the ellipses are as before.

Figure 3:
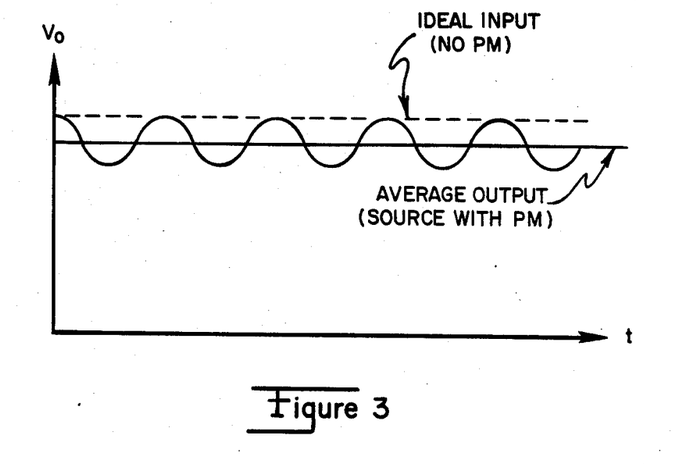
FIG. 3 compares the ideal detected output with the average output degraded by phase modulation.

For small B deviations, the synchronous detector output can be approximated by the first two terms shown above, a dc and an ac term. Since the term $J_0(B)$ is less than or equal to 1, which indicates that suppression of the dc term is taking place, there will be errors for inputs with phase modulation. As shown in FIG. 3, the actual average synchronous detector output falls below the ideal non-PM output.

If the phase errors as a percentage of dc output were constant, they would cancel in any relative measurement. Unfortunately, the percentage of error changes with the input level. Because of the design of the prior art PLL phase detector, the equivalent loop bandwidth is proportional to the input level. This changing bandwidth causes different amounts of input phase modulation to be tracked out by the VCO as the input level changes. Assuming that the input signal's spectral purity remains constant as the signal level varies, the change in PLL tracking produces a change in the percent error in the prior art synchronous detector's dc output. The end result is a nonlinearity in relative level measurements.

The second major problem that must be overcome when using a prior art tracking synchronous detector is additive noise at the input. This error will occur regardless of the spectral purity of the input carrier. It depends only on the input additive noise level. The error increases as the input SNR decreases.

Additive noise errors are caused by phase modulation of the VCO. In a mathematical analysis, the input signal with the additive noise looks like $$Vi(t) = Vs \cos wct + ni(t) \cos wct - nq(t) \sin wct, \qquad \text{Eq. 9}$$

causing the VCO signal to appear as $$2 \sin [wct + Eo(t)],$$

where Eo(t) is the error caused by the input noise. Since the phase detector is essentially a switching mixer like the synchronous detector, the phase detector output Ve(t) can be given by:

$$Ve(t) = Vs \sin Eo(t) + ni(t) \sin Eo(t) - nq(t) \cos Eo(T), \qquad \text{Eq. 10}$$

which does not include higher frequency terms removed by the loop filter. In order to find the error caused by the VCO's phase modulation, the term Eo(t)

must be determined. Unfortunately, due to intermodulation in the PLL between the VCO phase modulation quadrature sidebands and in-phase and quadrature components on the incoming additive noise, this determination is not straightforward. The best solution lies in a statistical representation of the magnitude of Eo(t). Previous analyses have shown that a relationship exists between $\overline{Eo(t)^2}$ and the SNR in the loop as follows:

$$\overline{Eo(t)^2} \cong \tfrac{1}{2}SNR, \qquad \text{Eq. 11}$$

where the over bar represents either time average or ensemble average, as appropriate, and SNR is defined as Ps/n2BL, Ps is the signal power at the PLL input, n is the noise spectral density also at the input, and BL is the PLL equivalent noise bandwidth.

In order to understand the error due to input noise in the prior art synchronous detector, assume that the VCO phase noise modulation is represented by Eo(t). By definition, this phase modulation is in phase quadrature with the VCO carrier signal. The phase modulated signal mixes in the synchronous detector with the incoming signal and additive noise. If the VCO noise was correlated with the incoming quadrature noise component, a dc component at the synchronous detectors's output would result. This component would add to the dc output caused by the VCO carrier mixing with the incoming carrier, causing a positive dc error.

In practice, however, the opposite occurs. The prior art synchronous detector's dc output is lower than that for an incoming signal of the same level with no additive noise. Due to the intermodulation that occurs in the PLL, the VCO phase modulation is uncorrelated with the incoming quadrature noise, and the synchronous detector's input phasors appear much as they do in FIG. 2A. Due to the relative jitter between the phases of the two synchronous detector inputs, the average detector dc output is decreased. The magnitude of the decrease depends on the SNR at the detector input. This causes a detector nonlinearity as the input signal level is varied.

SUMMARY OF THE INVENTION

The illustrated preferred embodiment of the invention compensates for and minimizes the PM- and additive-noise-caused errors of the prior art synchronous detector systems. In the preferred embodiment a synchronous detector is equipped with a phase lock loop (PLL) having, contrary to the prior art, a constant loop filter bandwidth. This PLL provides the correction signal to a local oscillator, which supplies the reference signal for the synchronous detector. The PLL, differing from the prior art, also has a variable gain.

An RMS detector is used for first-order correction of the additive noise in the synchronous detector system. The resolution filter passing the signal to the RMS detector is made to have a noise bandwidth identical to the loop noise bandwidth. This combination in the synchronous detector in accordance with the invention provides a wider loop bandwidth than those in the prior art synchronous detectors. The tracking problems associated with the narrow bandwidth filters of the prior art synchronous detectors are consequently greatly minimized.

DETAILED DESCRIPTION

Figure 4:
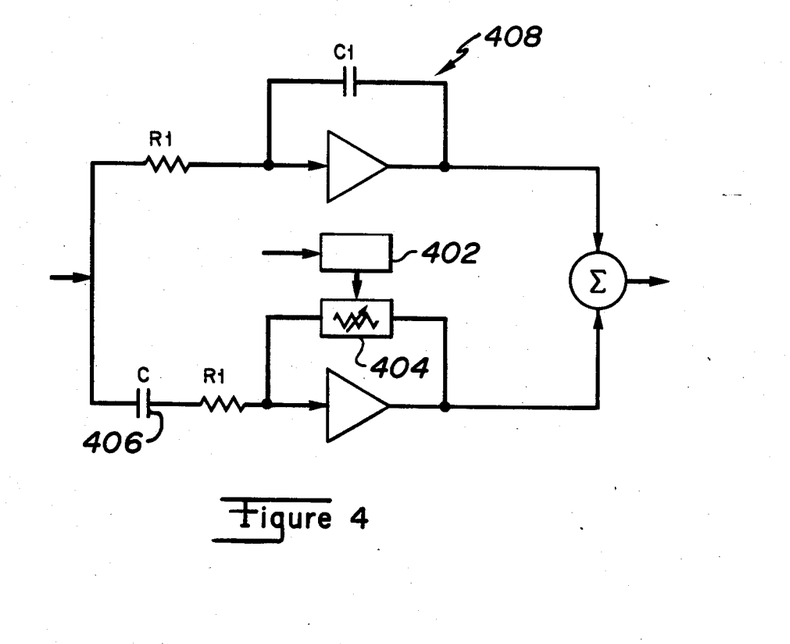
FIG. 4 illustrates a phase lock loop filter.

The synchronous detection in accordance with the preferred embodiment of the invention uses a PLL filter as shown in FIG. 4 to reduce phase-induced nonlinearities, or residual PM. In the illustrated embodiment, gain is made variable and is controlled, for example, by a microprocessor using a multiplying DAC 402 that changes the effective value of a feedback resistor 404. If capacitor C 406 in FIG. 4 is large enough, the transfer function of this loop filter 408 will be:

$$H(s) = [(R2/R1) + 1/sC1R1)]. \qquad \text{Eq. 8}$$

This loop filter 408 allows the PLL bandwidth in the synchronous detector in accordance with the invention to be held constant regardless of input signal level, thereby eliminating the PM-induced errors.

Figure 6:
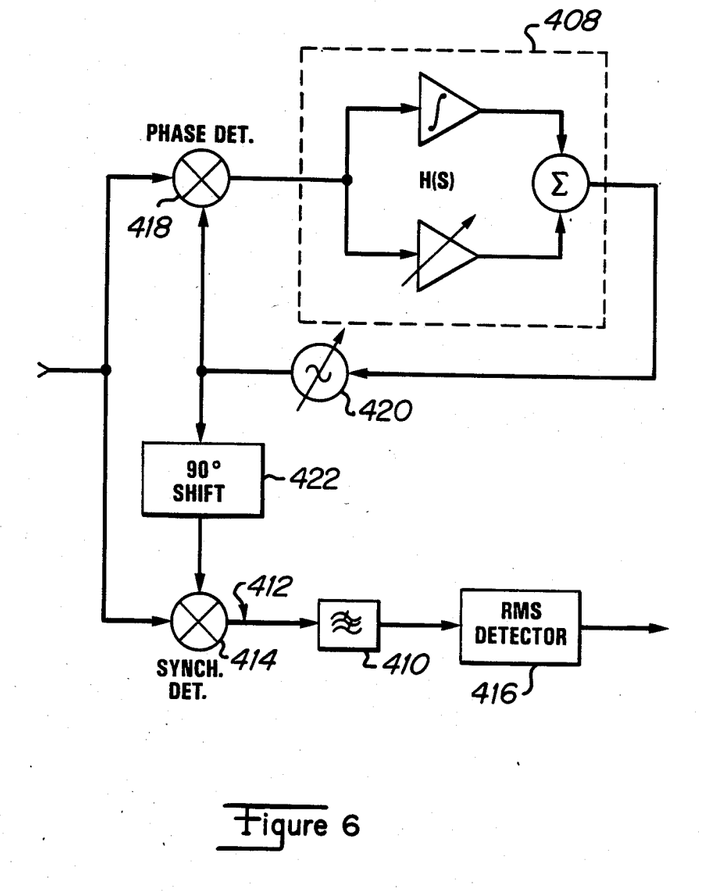
FIG. 6 illustrates an embodiment of the invention as a synchronous tracking detector system.

As shown in FIG. 6, the PLL bandwidth in the preferred embodiment is is made equal to the bandwidth of the noise filter 410 to eliminate the effect of the additive noise in the system. The principle to this scheme can be qualitatively explained as follows. Since the dc output 412 of the synchronous 414 is proportional to the average cosine projection of the input phasor on the VCO phasor, the error in the detector dc output 412 can be calculated from the SNR in the loop. The procedure is as follows:

$$\overline{Vo(t)} \propto \overline{\cos Eo(t)} \cong \cos(EoRMS); \qquad \text{Eq. 12}$$

$$EoRMS = (\overline{Eo^2})^{\tfrac{1}{2}} \cong (\tfrac{1}{2}SNR)^{\tfrac{1}{2}}; \qquad \text{Eq. 13}$$

$$\text{Error }(dB) = 20 \log(\cos EoRMS) = 20 \log \cos [(2SNR)^{-\tfrac{1}{2}}]. \qquad \text{Eq. 14}$$

If this error is a constant percentage of the input signal level, it would cancel, since the invention is used to make relative level measurements. However, the error is a function of the SNR, which varies with changes in the input level resulting in a synchronous detector output nonlinearity. If the SNR is known, the error in the dc output of the detector could be corrected mathematically via the following relation:

$$\text{Error }(dB) = 20 \log \cos[(2SNR)^{-\tfrac{1}{2}}]. \qquad \text{Eq. 15}$$

Figure 5:
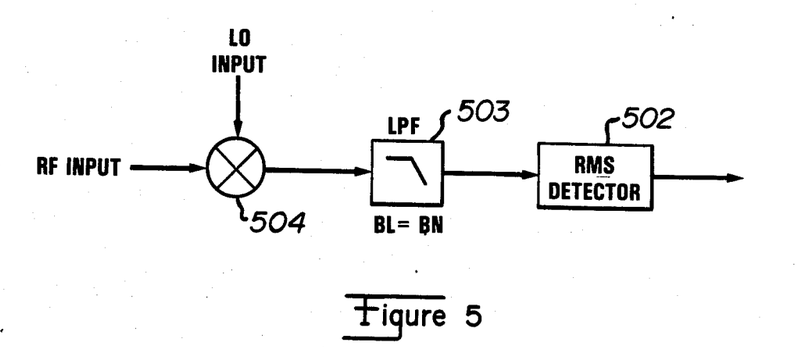
FIG. 5 shows a correction of error using an RMS detector as an analog computer in accordance with the invention.

In the preferred embodiment of the invention as shown in FIG. 5, the error is corrected by using an RMS detector as an analog computer. The illustrated invention eliminates the need to separately determine the SNR. The synchronous detector output voltage is the input to the RMS detector. The dc component is just the average value of this voltage. That is, $$Vo = Vs \cos Eo(t). \qquad \text{Eq. 16}$$

The following substitution can be made:

$$\overline{V_s \cos E_o(t)} \cong V_s \overline{[1 - (\tfrac{1}{2}) E_o(t)^2]} \quad \text{Eq. 17}$$

$$\cong V_s [1 - (\tfrac{1}{2}) \overline{E_o(t)^2}].$$

But it must be remembered that $$\overline{E_o(t)^2} = \tfrac{1}{2} SNR; \quad \text{Eq. 11}$$

thus, $$V_o = V_s[1 - (\tfrac{1}{2})(\tfrac{1}{2} SNR)]. \quad \text{Eq. 18}$$

By substituting $SNR = P_s/2nBL$ the following equivalence is obtained:

$$V_o = V_s[1 - (\tfrac{1}{2})(\tfrac{1}{2} P_s/2nBL)] \quad \text{Eq. 19}$$

$$= V_s[1 - (\tfrac{1}{4})(2nBL/P_s)].$$

Equation 19 represents the dc component of the synchronous detector output. It is the sum of the correct value Vs and an error term $(-V_s/4)(2nBL/P_s)$. They are both dc voltages and cannot be distinguished. Building upon this equation, total input Vi to the RMS detector 502 can be written as:

$$V_i = V_{dc} + V_{ac},$$

when $V_{dc}$ is equal to Equation 19 and $V_{ac}$ represents a zero-mean noise voltage. $V_{ac}$ is due to the noise applied to the input of the synchronous detector that is down-converted to baseband and filtered by BN.

Vi is the input to the RMS detector. Since the RMS detector computes the squared value of Vi, the average value of $V_i^2$, and the square root of $V_i^2$, the RMS detector output Vo can be represented as:

$$V_o = [\overline{V_i^2}]^{\tfrac{1}{2}}.$$

Therefore, from equation 19, $$V_i = V_s[1 - (\tfrac{1}{4})(2nBL/P_s)] + (V_s/V_s)[V_n(\text{in } BN)].$$

But $$\overline{V_i^2} = \overline{(V_{dc} + V_{ac})^2} = \overline{V_{dc}^2 + V_{ac}^2 + 2V_{dc}V_{ac}} \quad \text{Eq. 20}$$

$$= \overline{V_{dc}^2} + \overline{V_{ac}^2}.$$

By substituting the terms for $V_{dc}$ and $V_{ac}$ into this last equation, the following form results:

$$\overline{V_i^2} = \overline{V_s^2[1 - (\tfrac{1}{4})(2nBL/P_s)]^2} + \overline{V_s^2[V_n(\text{in } BN)/V_s]^2} \quad \text{Eq. 21}$$

$$= V_s^2[1 - (\tfrac{1}{2})(2nBL/P_s)] + V_s^2[P(\text{in } BN)/V_s^2],$$

where P(in BN) is the average power of the noise. Since $$P(\text{in } BN)/V_s^2 = 2nBN/V_s^2,$$

then $$\overline{V_i^2} = V_s^2[1 - (\tfrac{1}{2})(2nBL/P_s) + 2nBN/V_s^2]. \quad \text{Eq. 22}$$

The term 2nBL/Ps represents the SNR$-1$ at the input to both the PLL and the synchronous detector. Since Vs is the peak voltage of the signal component of this input, $V_s^2 = 2P_s$. Substituting Eq. 22 into Eq. 21, the final result appears as:

$$\overline{V_i^2} = V_s^2[1 - (\tfrac{1}{2})(2nBL/P_s) + (\tfrac{1}{2})(2nBN/P_s)]. \quad \text{Eq. 23}$$

This last equation shows that by setting BN=BL, the last two terms will cancel, leaving $\overline{V_i^2} = V_s^2$, which leads to the RMS detector final output of $$V_o = [\overline{V_i^2}]^{\tfrac{1}{2}}$$

$$= [V_s^2]^{\tfrac{1}{2}}$$

$$= V_s.$$

Thus, the error due to additive noise has been effectively cancelled. Therefore, in accordance with the invention, the bandwidth BL of the loop and the bandwidth BN of the noise filter 410 in FIG. 6 are made equal. Furthermore, filter bandwidths BL and BN are made constant.

In accordance with the preferred embodiment of the invention the VCO power is made constant as follows. When the PLL transfers phase noise onto the VCO, the power in the VCO carrier is reduced by the amount of power that goes into the phase noise sidebands. Since the dc output of the synchronous detector is proportional only to the VCO carrier, the output in accordance with the invention is suppressed by this amount. When BN=BL, the RMS detector adds a voltage based on the same amount of noise power that is taken from the VCO carrier line.

Figure 7:
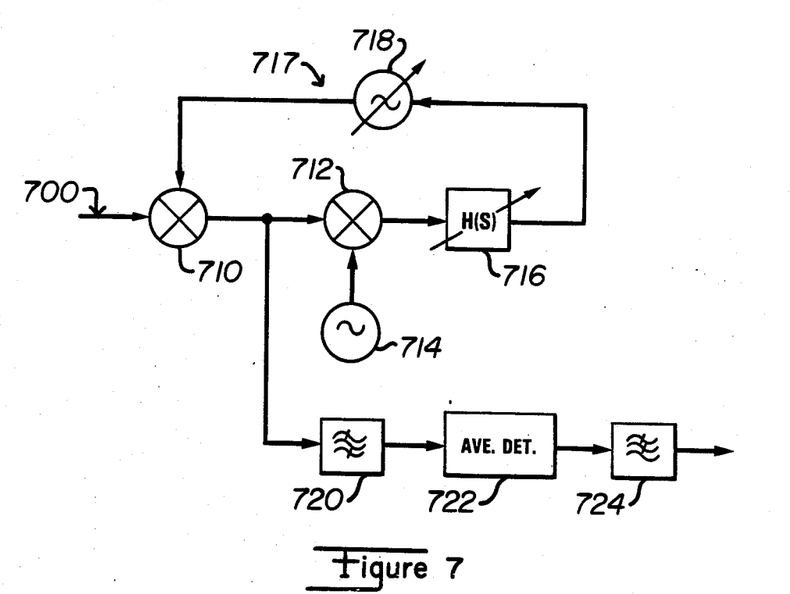
FIG. 7 illustrates an embodiment of the invention as a nonsynchronous tracking detector system.

An alternate embodiment of the invention is shown in FIG. 7. In this alternate embodiment, a nonsynchronous tracking detector system with error correction in accordance with the invention is realized. As illustrated, an input signal 700 enters an input mixer 710 and is mixed to an intermediate frequency (IF) signal using the output 717 of a phase lock loop comprising a detector 712, a variable loop bandwidth 716, and a variable oscillator 718. The IF signal 717 is maintained at the same frequency as a reference oscillator 714 by the phase lock loop. The noise-induced measurement error created in the phase lock loop is then corrected by detecting a bandpass-filtered version of the IF signal using filters 720, 724, and an average detector 722. The condition for complete correction of the error in this embodiment is that the IF bandpass filter bandwidth be exactly twice the phase lock loop bandwidth.

We claim:

1. A noise-compensated synchronous detector system comprising:
   a synchronous detector having a first signal and a second signal synchronized to said first signal as input signals;
   synchronizer means for providing said second signal to said synchronous detector, wherein said synchronizer means has a fixed noise bandwidth B;
   a resolution filter having said fixed noise bandwidth B coupled to an output of said synchronous detector; and
   an RMS detector having an input coupled to an output of said resolution filter for compensating noise induced errors in said output of said synchronous detector, said RMS detector having a detector system output;

whereby noise and perturbation effects are reduced at said detector system output because said synchronizer means and said resolution filter have the same noise bandwidth B.

2. The synchronous detector system as in claim 1 wherein said synchronizer means further comprises:
   a loop filter having variable gain for establishing a fixed loop noise bandwidth B;
   a variable oscillator coupled to an output of said loop filter and responsive thereto to provide a loop signal;
   phase shift means coupled to an output of said variable oscillator, said phase shift means being responsive to said loop signal and operative to phase shift said loop signal by 90 degrees to develop said second signal at an output thereof; and
   a phase detector having said first signal and said loop signal as input signals, said phase detector having an output which develops an output signal responsive to said input signals, said output of said phase detector being coupled to an input of said loop filter as an input signal.

3. A noise-compensated synchronous tracking detector system comprising:
   an input port for receiving a first input signal;
   a first frequency converter having as input signals said first input signal and a loop signal to provide a first frequency converter output signal at an output thereof;
   a loop filter having said first frequency converter output signal connected thereto as an input signal, said loop filter having a variable gain to maintain a constant noise bandwidth B;
   a variable oscillator coupled to an output of said loop filter and responsive thereto to provide said loop signal to said first frequency converter;
   a second frequency converter having as input signals said first input signal and said loop signal shifted by 90 degrees in phase to provide a second frequency converter output signal;
   a resolution filter having a bandwidth equal to said constant noise bandwidth B coupled to an output port of said second frequency converter for receiving said second frequency converter ouput signal; and
   an RMS detector connected to an output port of said resolutin filter to provide a detected signal which is noise-compensated due to the fact that said loop filter and said resolution filter have the same constant noise bandwidth B.

4. A noise-compensated nonsynchronous tracking detector system comprising:
   an input port for receiving a first input signal;
   a frequency converter having as input signals said first input signal and a second input signal;
   a phase detector coupled to an output of said frequency converter;
   a loop filter coupled to an output of said phase detector;
   a variable oscillator coupled to an output of said loop filter, said vairable oscillator being operative to provide said second input signal, where said frequency converter, phase detector, loop filter, and variable oscillator form a closed loop having a predetermined noise bandwidth B;
   a resolution filter having a predetermined noise bandwidth 2B coupled to said output of said frequency converter; and
   an average detector coupled to an output of said resolution filter for developing a detector system output;
   wherein noise and perturbations in said detector system output are reduced as a result of said resolution filter having a predetermined noise bandwidth 2B which is twice the noise bandwidth B of said closed loop.

5. A noise-compensated synchronous detector system comprising:
   a synchronous detector having a first signal and a second signal synchronized to said first signal as input signals;
   synchronizer means for providing said second signal to said synchronous detector, said synchronizer means having a fixed noise bandwidth B and including:
     a loop filter having variable gain for establishing said fixed loop noise bandwidth B, said loop filter having:
       integrator means having an input and an output, where said input of said integrator means is coupled to said output of said phase detector;
       variable gain amplifier means having an input and an output, where said input of said variable gain amplifier means is coupled to said output of said phase detector; and
       summation means having inputs coupled to said outputs of said integrator means and said variable amplifier means, said summation means having an output comprising said output of said loop filter;
     a variable oscillator coupled to an output of said loop filter and responsive thereto to provide a loop signal;
     phase shift means coupled to an output of said variable oscillator, said phase shift means being responsive to said loop signal and operative to phase shift said loop signal by 90 degrees to develop said second signal at an output thereof; and
     a phase detector having said first signal and said loop signal as input signals, said phase detector having an output which develops an output signal responsive to said inputs signals, said output of said phase detector being coupled to an input of said loop filter as an input signal;
   a resolution filter having said fixed noise bandwidth B coupled to an output of said synchronous detector; and
   an RMS detector having an input coupled to an output of said resolution filter to compensate for noise induced errors in said output of said synchronous detector, said RMS detector having a detector system output;
   whereby noise and perturbation effects are reduced at said detector system output because said synchronizer means and said resolution filter have the same noise bandwidth B.

6. The synchronous detector system as in claim 5 wherein said variable amplifier means includes:
   amplifier means having an input and an output;
   variable feedback means coupling said input and said output of said amplifier means; and
   control means for controlling said variable feedback means.

7. The synchronous detector system as in claim 6 wherein said variable feedback means includes a variable resistance, and wherein said control means includes digital processing means and digital-to-analog means responsive to said digital processing means and operative to control said variable resistance.

8. A noise-compensated synchronous tracking detector system comprising:
   an input port for receiving a first input signal;
   a first frequency converter having as input signals said first input signal and a loop signal to provide a first frequency converter output signal at an output thereof;
   a loop filter having said first frequency converter output signal connected thereto as an input signal, said loop filter having a variable gain to maintain a constant noise bandwidth B, said loop filter including:
      integrator means having an input and an output, where said input of said integrator means is coupled to said output of said first frequency converter;
      variable gain amplifier means having an input and an output, where said input of said variable gain amplifier means is coupled to said output of said first frequency converter; and
      summation means having inputs coupled to said outputs of said integrator means and said variable amplifier means, said summation means having an output comprising said output of said loop filter;
   a variable oscillator coupled to an output of said loop filter and responsive thereto to provide said loop signal to said first frequency converter;
   a second frequency converter having as input signals said first input signal and said loop signal shifted by 90 degrees in phase to provide a second frequency converter output signal;
   a resolution filter having a bandwidth equal to said constant noise bandwidth B coupled to an output port of said second frequency converter for receiving said second frequency converter output signal; and
   an RMS detector connected to an output port of said resolution filter to provide a detected signal which is noise compensated because said loop filter and said resolution filter have the same constant noise bandwidth B.

9. The synchronous detector system as in claim 8 wherein said variable amplifier means includes:
   amplifier means having an input and an output;
   variable feedback means coupling said input and said output of said amplifier means; and
   control means for controlling said variable feedback means.

10. The synchronous detector system as in claim 9 wherein said variable feedback means includes a variable resistance, and wherein said control means includes digital processing means and digital-to-analog means responsive to said digital processing means and operative to control said variable resistance.

11. In a synchronous detector system including a phase lock loop, an improved phase lock loop filter comprising:
   loop input means;
   integrator means having an input and an output, where said input of said integrator means is coupled to said loop input means;
   variable amplifier means having an input and an output, where said input of said variable amplifier means is coupled to said loop input means;
   summation means having a plurality of inputs and an output, where said output of said integrator means is coupled to one of said inputs of said summation means and said output of said variable amplifier means is coupled to another one of said inputs of said summation means; and
   loop output means coupled to said output of said summation means.

12. The phase lock loop filter as in claim 11 wherein said variable amplifier means includes:
   amplifier means having an input and an output;
   variable feedback means coupling said input and said output of said amplifier means; and
   control means for controlling said variable feedback means.

13. The phase lock loop filter as in claim 12 wherein said variable feedback means includes digital processing means and digital-to-analog means responsive to said digital processing means and operative to control said variable resistance.

* * * * *